(12) United States Patent
Lee

(10) Patent No.: US 6,989,293 B2
(45) Date of Patent: Jan. 24, 2006

(54) THERMALLY ENHANCED PACKAGING STRUCTURE AND FABRICATION METHOD THEREOF

(75) Inventor: Tsung-Hung Lee, Taoyuan (TW)

(73) Assignee: Benq Corporation, Taoyuan (TW)

( * ) Notice: Subject to any disclaimer, the term of this patent is extended or adjusted under 35 U.S.C. 154(b) by 0 days.

(21) Appl. No.: 10/965,549

(22) Filed: Oct. 14, 2004

(65) Prior Publication Data

US 2005/0085011 A1 Apr. 21, 2005

(30) Foreign Application Priority Data

Oct. 15, 2003 (TW) .............................. 92128507 A (51) Int. Cl.
*H01L 21/44* (2006.01)
(52) U.S. Cl. ........................ 438/106; 257/777; 257/779
(58) Field of Classification Search ................ 438/106
See application file for complete search history.

(56) References Cited

U.S. PATENT DOCUMENTS

| | | | | |
|---|---|---|---|---|
| 5,541,450 A | * | 7/1996 | Jones et al. ................. | 257/697 |
| 5,708,567 A | * | 1/1998 | Shim et al. .................. | 361/723 |
| 6,005,289 A | * | 12/1999 | Watanabe et al. ........... | 257/700 |
| 6,720,651 B2 | * | 4/2004 | Gaku et al. .................. | 257/707 |

* cited by examiner

*Primary Examiner*—Thao P. Le
(74) *Attorney, Agent, or Firm*—Thomas, Kayden, Horstemeyer & Risley (57) ABSTRACT

A thermally enhanced packaging structure and fabrication method thereof. The structure includes a printed circuit board (PCB), heat-conductive substrate laminated with the PCB, first chip on the heat-conductive substrate, conductor electrically connecting the chip and PCB, and isolation structure isolating the chip and conductor from the external environment.

31 Claims, 14 Drawing Sheets

THERMALLY ENHANCED PACKAGING STRUCTURE AND FABRICATION METHOD THEREOF

BACKGROUND OF THE INVENTION

1. Field of the Invention

The present invention relates to a semiconductor packaging structure and fabrication method thereof, and more specifically to a thermally enhanced packaging structure and fabrication method thereof.

2. Description of the Related Art

A conventional semiconductor package is attached to a printed circuit board (PCB) of an electronic product by using surface mount technology (SMT). SMT usually comprises applying a solder paste on a pad of the PCB, putting the package onto the solder paste for connecting the contact of the package and the wiring of the PCB, and then proceeding the reflow process. The reflow process is heating the PCB up to the melting point of the solder paste, and cooling the melting solder paste to achieve soldering the package's contact and the pad. The package has normally experienced the reflow process at least once when the electronic product is finished.

When using eutectic tin-lead alloy as solder paste, the melting point is approximately 183° C., and peak temperature during the reflow process is usually between 220° C. and 240° C. However, using lead-free solder paste is necessary to obey the requirements of Green product. The common materials are tin-silver alloy and tin-silver-copper alloy. When using the common lead-free solder paste, the melting point is between 215° C. and 220° C., and peak temperature during the reflow process is usually approximately 250° C. The peak temperature is sufficient to thermally deform the package and PCB, and retains stress between the package and PCB after the reflow process, which would negatively affect the reliability of the package and the electronic product.

Take digital camera as an example. Image captured products such as digital cameras include image ICs, and each image IC has an image sensor. The image sensor is a heat sensitive device and is often damaged during the reflow process, which affects the reliability of the package of the image IC and image-captured product.

Due to the demand for small and light electronic products, it is necessary to lay out more devices on limited semiconductor substrates of IC chips. That would be a challenge for heat dissipation of the package. To dissipate heat from a non-image IC package, a heat-conductive sheet or heat sink may be disposed on the encapsulant of the package, or some thermal contacts of a package can be provided to conduct the heat to the PCB. However, setting the heat-conductive sheet/heat sink on the encapsulant complicates encapsulant formation, and the ambient moisture may diffuse in the package along the interface between the heat-conductive sheet/heat sink and encapsulant to affect reliability of the package. Moreover, because the cross-sectional area of the thermal contact is small, when the thermal contact is provided in the package, the effect of heat dissipation is limited.

In a conventional image IC package, the image IC is covered by a transparent material, making it difficult to set a heat-conductive sheet or heat sink thereon. Therefore, the provision of heat contacts is the only way for heat dissipation of the image IC package. The effect thereof is limited.

SUMMARY OF THE INVENTION

Thus, objects of the present invention are by providing a thermally enhanced packaging structure and fabrication method thereof to prevent packaged IC chips from thermal cycle of the reflow process, improve the heat dissipation, and improve product reliability and structure strength.

In order to achieve the described objects, the present invention provides a method of fabricating a thermally enhanced packaging structure. First, a printed circuit board (PCB) having a top surface and a bottom surface is provided. The top surface has a packaging area and a first external device contact area. The packaging area has a chip attaching region and a first contact beyond the chip attaching region. The chip attaching region includes a hole through the PCB. The first external device contact area has a second contact electrically connected to the first contact. Then, a heat-conductive substrate having a first surface and an opposing second surface is provided. Next, the first surface of the heat-conductive substrate and the bottom surface of the PCB are laminated, with at least part of the heat-conductive substrate exposed by the hole through the PCB. Next, a first chip, having a bond pad, is attached to the heat-conductive substrate exposed by the hole through the PCB. Further, a conductor electrically connecting the first contact and the bond pad is formed. Finally, an isolation structure is formed to isolate the first chip, the bond pad, the conductor, and the first contact from the external environment.

The present invention further provides a thermally enhanced packaging structure having a printed circuit board (PCB), a heat-conductive substrate, a first chip, a conductor, and an isolation structure. The PCB has a top surface and a bottom surface. The top surface has a packaging area and a first external device contact area. The packaging area has a chip attaching region and a first contact beyond the chip attaching region. The chip attaching region includes a hole through the PCB. The first external device contact area has a second contact electrically connected to the first contact. The heat-conductive substrate, having a first surface connecting to the bottom surface of the PCB and an opposing second surface, is partially exposed by the hole through the PCB. The first chip, having a bond pad, is attached to the heat-conductive substrate exposed by the hole through the PCB. The conductor electrically connects the first contact and the bond pad. The isolation structure isolates the first chip, the bond pad, the conductor, and the first contact from the external environment.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

The following embodiment is intended to illustrate the invention more fully without limiting the scope of the claims, since numerous modifications and variations will be apparent to those skilled in this art.

First Embodiment

FIGS. 1A through 1H and FIGS. 2A through 2J are top views and cross-sections illustrating the first embodiment of the present invention. The first embodiment is about a thermally enhanced packaging structure of a non-image IC and the fabrication method thereof.

Figure 1A:
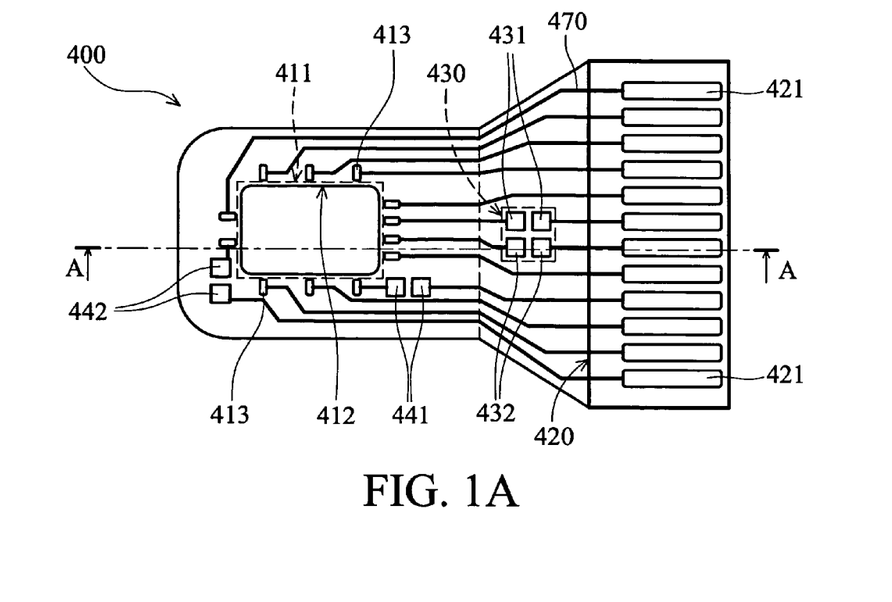
FIGS. 1A through 1H are top views of a thermally enhanced packaging structure and the fabrication method thereof according to the first embodiment of the present invention.
Figure 2A:
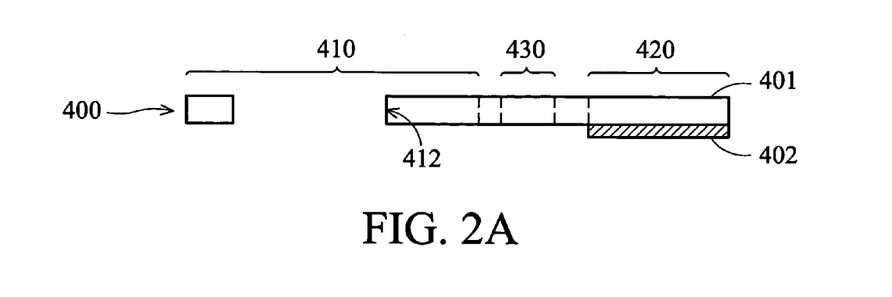

In FIG. 1A and FIG. 2A, a cross-section along line AA in FIG. 1A, a printed circuit board (PCB) 400, having a top surface 401 and a bottom surface 402, is provided. As shown in FIG. 1A, PCB 400 has a packaging area 410, a first external device contact area 420, and an optional second external device contact area 430. The packaging area 410 has a chip attaching region 411 and first contacts 413 beyond the chip attaching region 411. The chip attaching region 411 includes a hole 412 through PCB 400. The first external device contact area 420 has second contacts 421 electrically connected to first contacts 413 by wirings 470. The second external device contact area 430 has third contacts 431 and 432 electrically connected to the first contact 413 and/or second contact 421 as desired. Further, the packaging area 410 optionally has other third contacts 441 and 442 electrically connected to the first contact 413 and/or second contact 421 as desired.

Figure 1B:
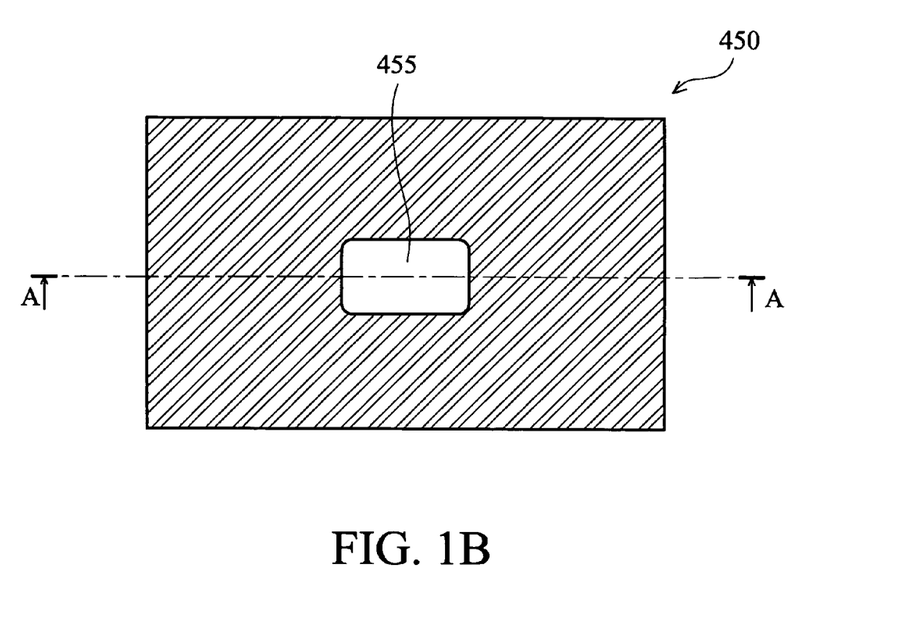
Figure 1E:
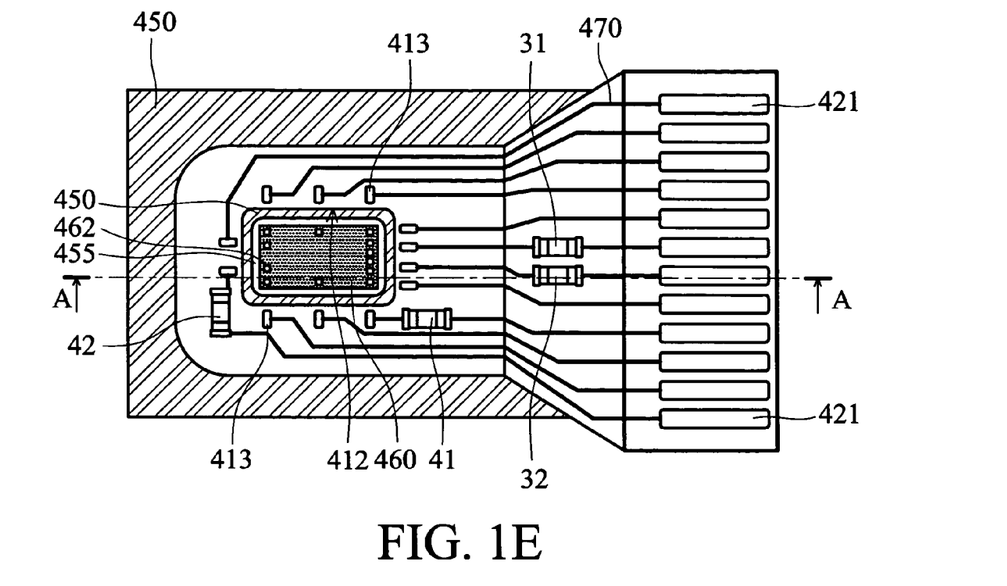
Figure 2B:
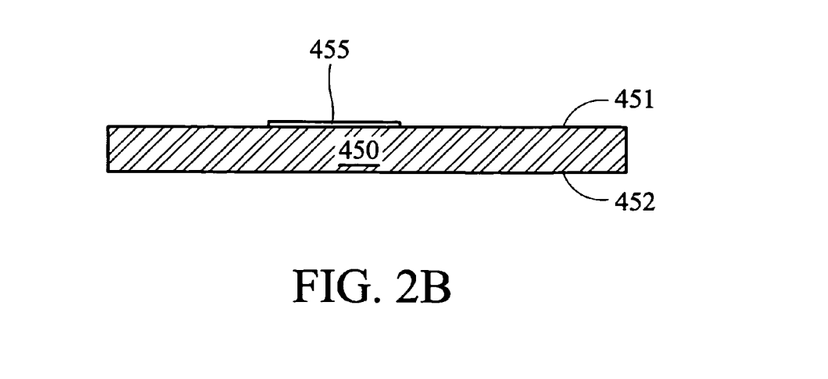

In FIG. 1B and FIG. 2B, a cross-section along line AA in FIG. 1B, a heat-conductive substrate 450, having a first surface 451 and an opposing second surface 452, is provided. As shown in FIG. 1B, a die bond layer 455 is optionally provided on the first surface 451 to improve bonding strength between non-image IC chip 460 (shown in FIGS. 1E and 2E) and heat-conductive substrate 450 in further subsequent steps. When subsequently laminating the heat-conductive substrate 450 and PCB 400, part of heat-conductive substrate 450 and die bond layer 455 are exposed by the hole 412. The heat-conductive substrate 450 can be metal, ceramic, or other substrate with high heat dissipation capability. The die bond layer 455 can be made of nickel/gold, tin-lead alloy, silver-containing alloy, or copper-containing alloy. The die bond layer 455 can be formed on the heat-conductive substrate 450 by electroplating, PVD such as sputtering, CVD, or other methods.

Figure 1C:
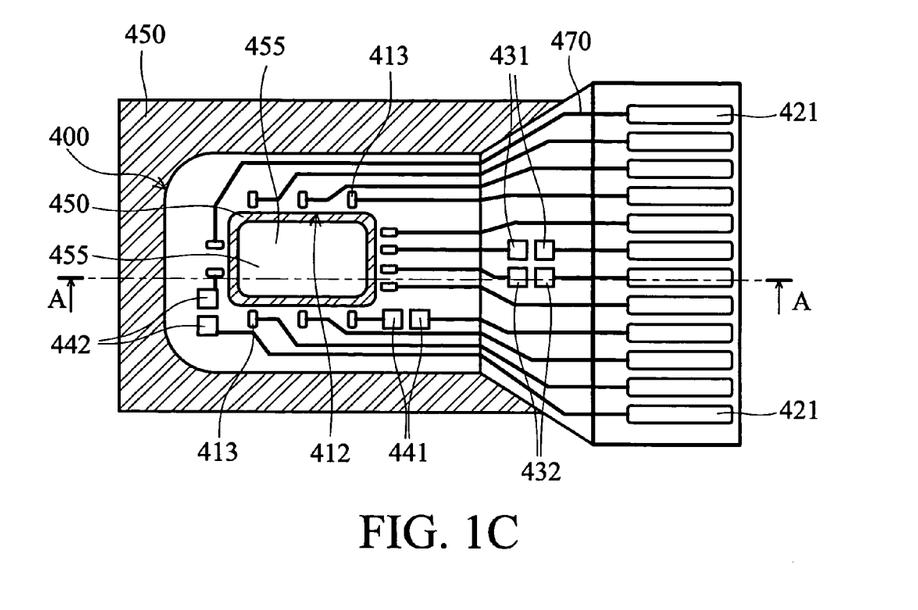
Figure 2C:
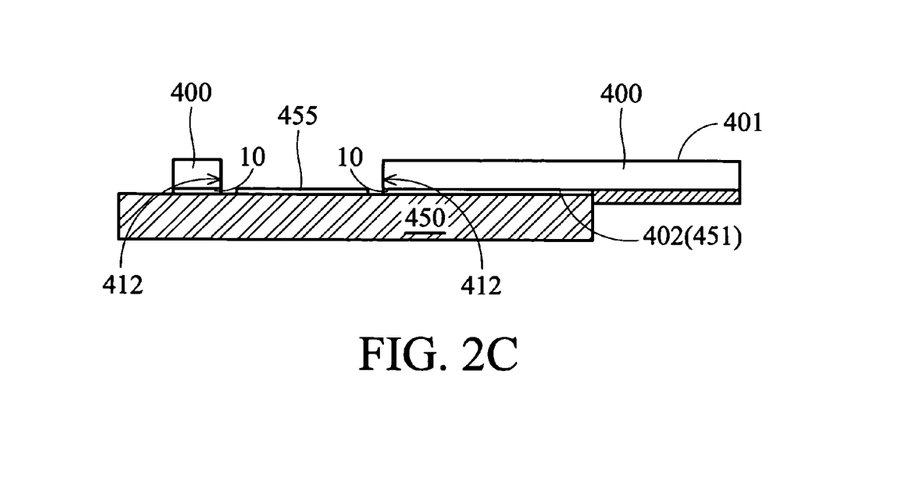

In FIG. 1C and FIG. 2C, a cross-section along line AA in FIG. 1C, the first surface 451 of heat-conductive substrate 450 and the bottom surface 402 of PCB 400 are laminated, the hole 412 exposing part of heat-conductive substrate 450 and die bond layer 455. In this embodiment, the exposed area of heat-conductive substrate 450 and the area of hole 412 are both larger than non-image IC chip 460 (shown in FIGS. 1E and 2E). The chip 460 is preferably completely attached to heat-conductive substrate 450 in the subsequent step for better product reliability.

In the step shown in FIG. 1C and FIG. 2C, a laminating material 10, such as a mixture of epoxy and silver powders, is preferably formed on the bottom surface 402 of PCB 400. The first surface 451 of the heat-conductive substrate 450 and bottom surface 402 of the PCB 400 are then assembled, pressed, heated but not exceeded 120° C., and cured the laminating material 10, completing the laminating step.

Further, the exposed area of heat-conductive substrate 450 and the area of hole 412 may be smaller than the chip 460. Thus, contact area of the chip 460 and heat-conductive substrate 450 is decreased, lowering heat dissipation capability. When the area of hole 412 is smaller than the chip 460, it is necessary to form thicker laminating material 10 between the chip 460 and heat-conductive substrate 450, which would be more possibly forming voids in the laminating material 10 during the laminating step.

Figure 1D:
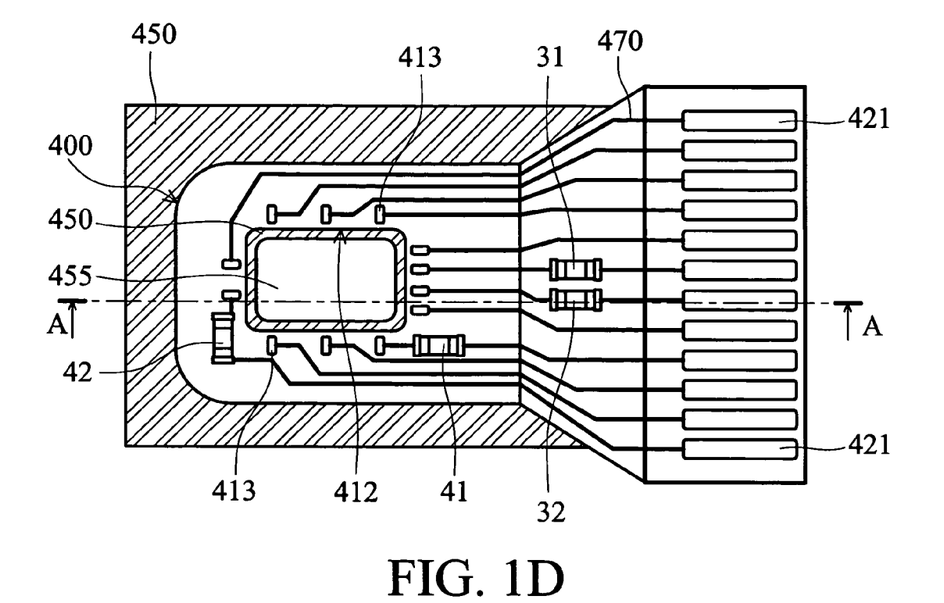
Figure 2D:
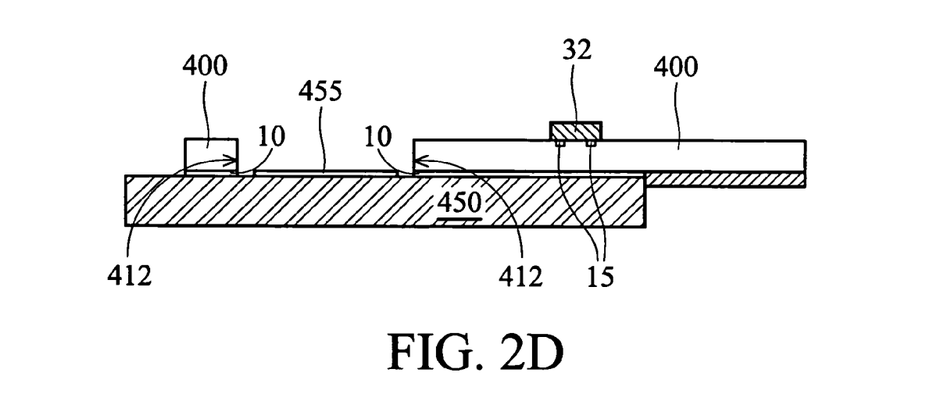

In FIG. 1D and FIG. 2D, a cross-section along line AA in FIG. 1D, the second external devices 31, 32, 41, and 42, such as passive devices, second chips, packages of a third chip, or combinations thereof, can be provided as desired, respectively electrically connected to the third contacts 431, 432, 441, and 442. In this embodiment, the second external devices 31, 32, 41, and 42 are all passive devices. The second external devices 31, 32, 41, and 42 can attach to the third contacts 431, 432, 441, and 442 using SMT, wherein solder paste 15, such as lead-containing or lead-free tin alloy, is formed on the third contacts 431, 432, 441, and 442 by a method such as stencil printing. The second external devices 31, 32, 41, and 42 are then respectively placed on the third contacts 431, 432, 441, and 442. This assembly is heated to a temperature exceeding the melting point of solder paste 15, reflowing the solder paste 15, thereby respectively electrically connecting the second external devices 31, 32, 41, and 42 to the third contacts 431, 432, 441, and 442. Further, a cleaning step can be added as desired to clean PCB 400. Note that the reflow process is performed prior to attaching chip 460.

Figure 2E:
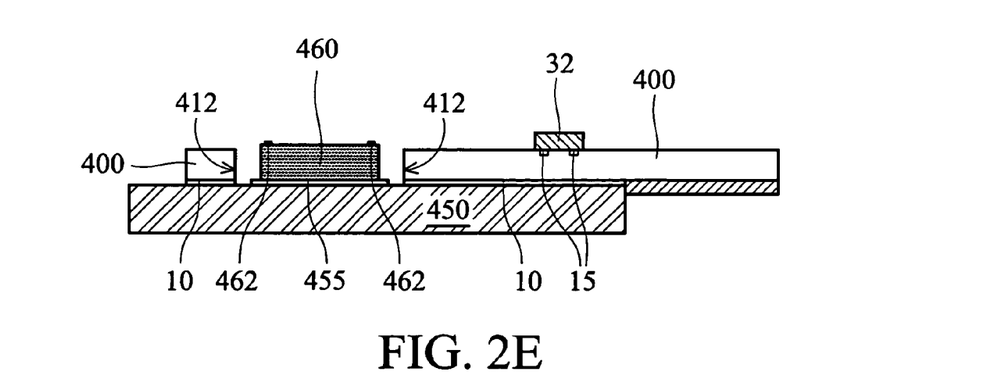

In FIG. 1E and FIG. 2E, a cross-section along line AA in FIG. 1E, a non-image IC chip 460, having at least one bond pad 462, is placed in the hole 412 of PCB 400, and attached to the heat-conductive substrate 450 exposed by the hole 412 by a method such as die bonding. For example, a glue material (not shown in figures), such as epoxy or a mixture of epoxy and silver powders, can be formed between the die bond layer 455 and non-image IC chip 460. This assembly is then heated but not exceeded 120° C., and cured the glue material, finishing the attachment of chip 460. When the die bond layer 455 is provided as mentioned, bonding strength between chip 460 and heat-conductive substrate 450 is improved, enhancing the process yield and product reliability.

Figures 1F, 2F:
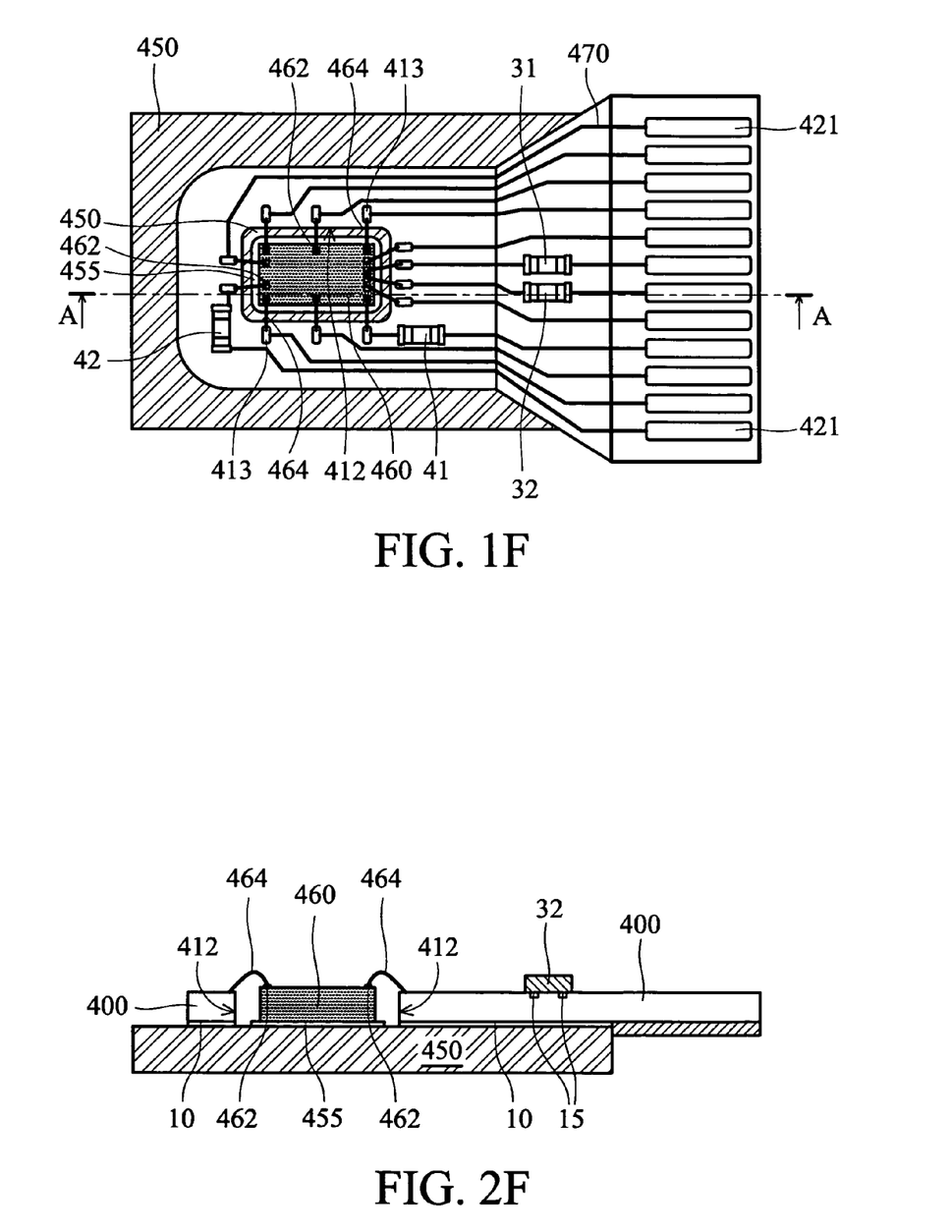
FIGS. 2A through 2J are cross-sections of the thermally enhanced packaging structure and the fabrication method thereof according to the first embodiment of the present invention.

In FIG. 1F and FIG. 2F, a cross-section along line AA in FIG. 1F, a conductor 464 is formed to connect bond pad 462 and the first contact 413. The conductor 464 is normally gold or gold alloy, but may be aluminum in some situations. At this time, the second contact 421 electrically connects to chip 460 using wiring 470.

An isolation structure is formed in the subsequent step, isolating the chip 460, bond pad 462, conductive material 464, and first contact 413 from the external environment. The isolation structure can be formed by dispensing or injection molding, respectively shown in FIG. 1G (FIG. 2G) and FIG. 1H (FIG. 2H).

Figure 1G:
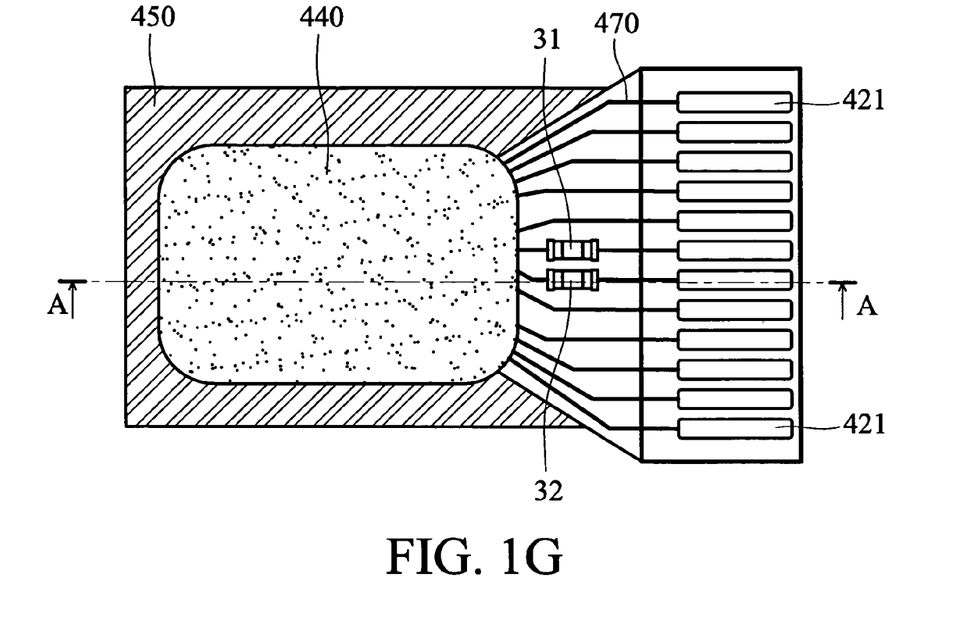
Figure 2G:
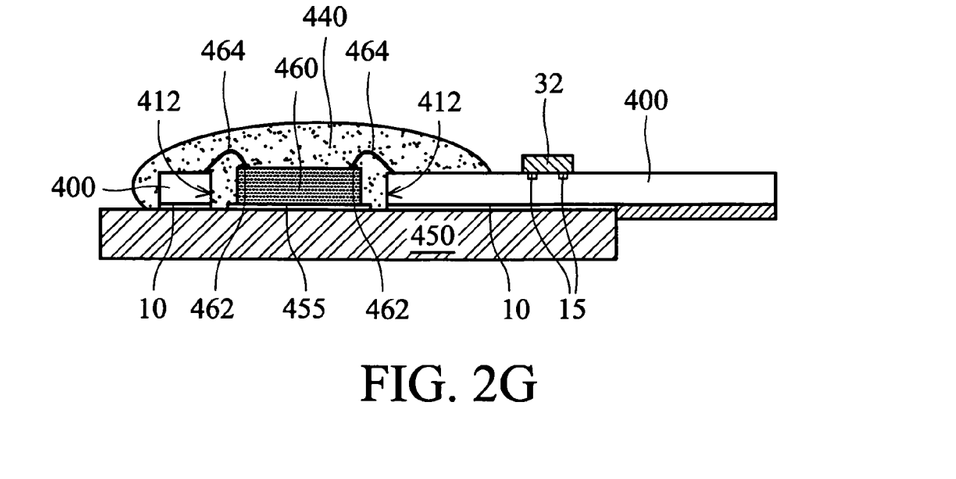

In FIG. 1G and FIG. 2G, a cross-section along line AA in FIG. 1G, of an encapsulant 440, formed by dispensing, as the isolation structure is shown. In this step, a viscous thermosetting gel such as epoxy, polyimide, polyester, or encapsulation molding compound is dispensed by a dispenser (not shown), covering the packaging area 410, isolating the chip 460, bond pad 462, conductor 464, first contact 413, and optional second external devices 41, 42 from the external environment. The gel may cover parts of the heat-conductive substrate 450 near the packaging area 410. The gel is then heated, cured, and hardened to form encapsulant 440. Thus, the thermally enhanced packaging structure 1 of this embodiment is completed.

Figure 1H:
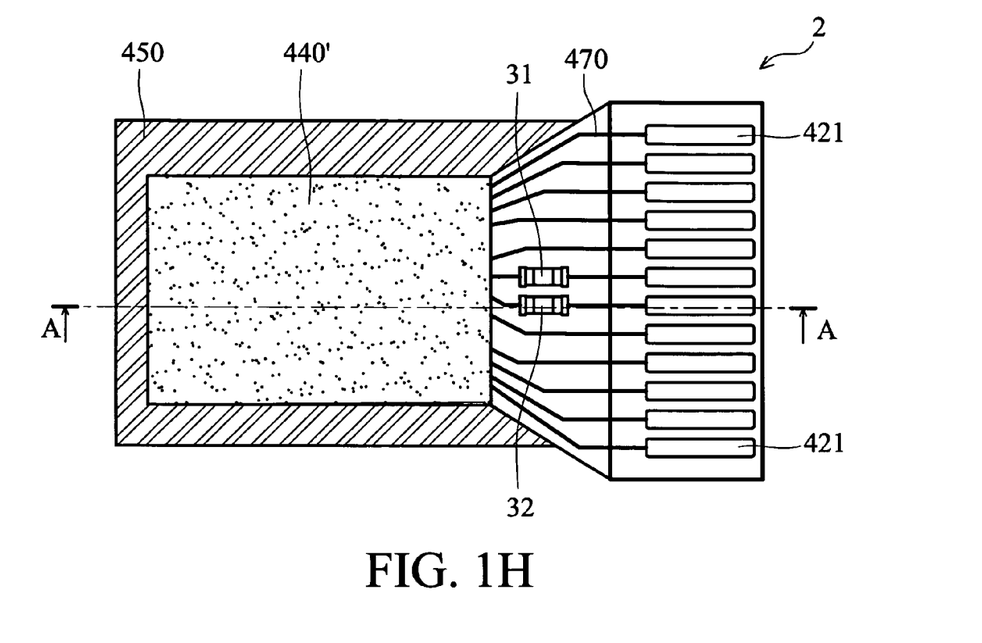
Figure 2H:
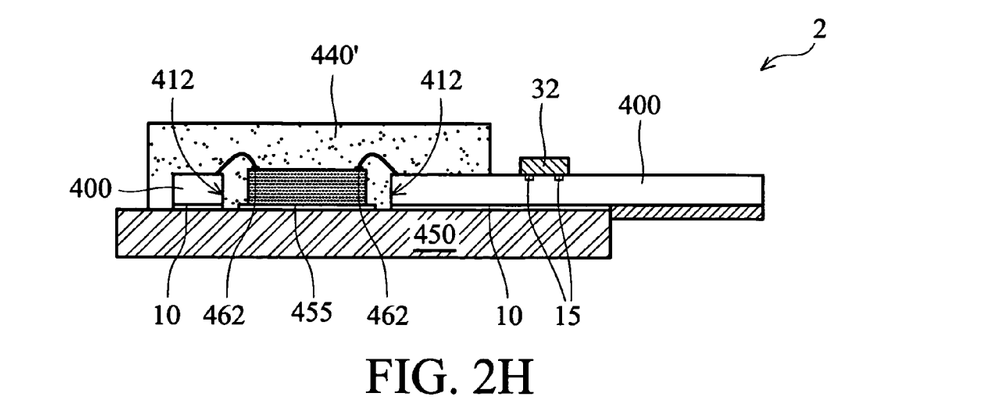

In FIG. 1H and FIG. 2H, a cross-section along line AA in FIG. 1H, an encapsulant 440', formed by injection molding, acting as the isolation structure is shown. A mold chest (not shown), previously designed according to the profile of PCB 400, heat-conductive substrate 450, predetermined profile of encapsulant 440', etc. The mold chest has a chamber whose profile matches the predetermined profile of encapsulant 440'. In this step, PCB 400 is pressed by the mold chest, resulting in the chamber covering the packaging area 410. Parts of the heat-conductive substrate 450 near the packaging area 410 may be covered by the chamber. A molding material, such as epoxy, polyimide, polyester, or encapsulation molding compound, is liquefied by pressure, heated to a temperature between 150° C. and 200° C., and injected the chamber. The injected molding material covers the packaging area 410 and the area of the heat-conductive substrate 450 near the packaging area 410, and solidifies to form the encapsulant 440'. Therefore, the chip 460, bond pad 462, conductive material 464, first contact 413, and optional second external devices 41, 42 are isolated from the external environment. Then, the encapsulant 440' is heated and cured. Thus, the thermally enhanced packaging structure 2 of this embodiment is completed.

Figure 2I:
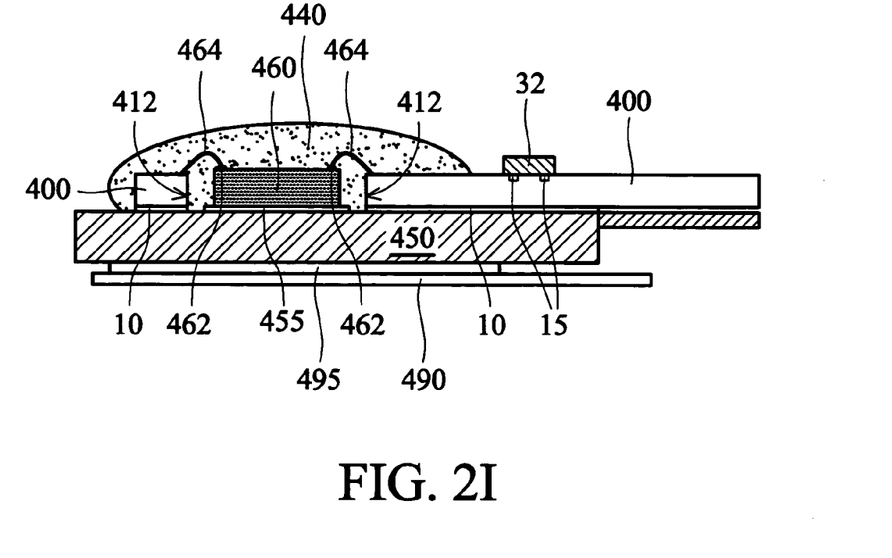
Figure 2J:
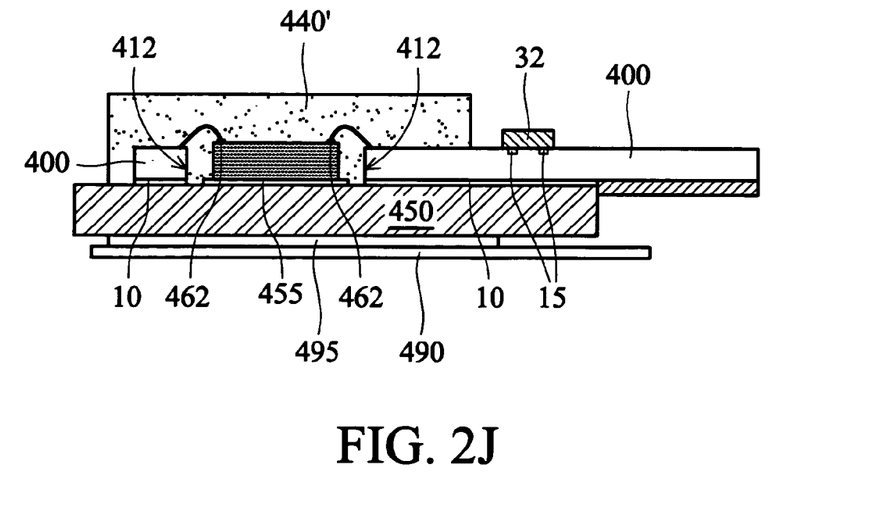

FIGS. 2I and 2J respectively illustrates an application example of thermally enhanced packaging structures 1 and 2. A heat-conductive layer 495 is formed on the second surface 452 of heat-conductive substrates 450 of thermally enhanced packaging structures 1 and 2. A heat dissipative media 490 connects to the heat-conductive substrates 450 by the heat-conductive layer 495. The heat dissipative media 490 can be a heat sink, another PCB, or other devices providing dissipation of heat from thermally enhanced packaging structures 1 and 2.

Figure 5:
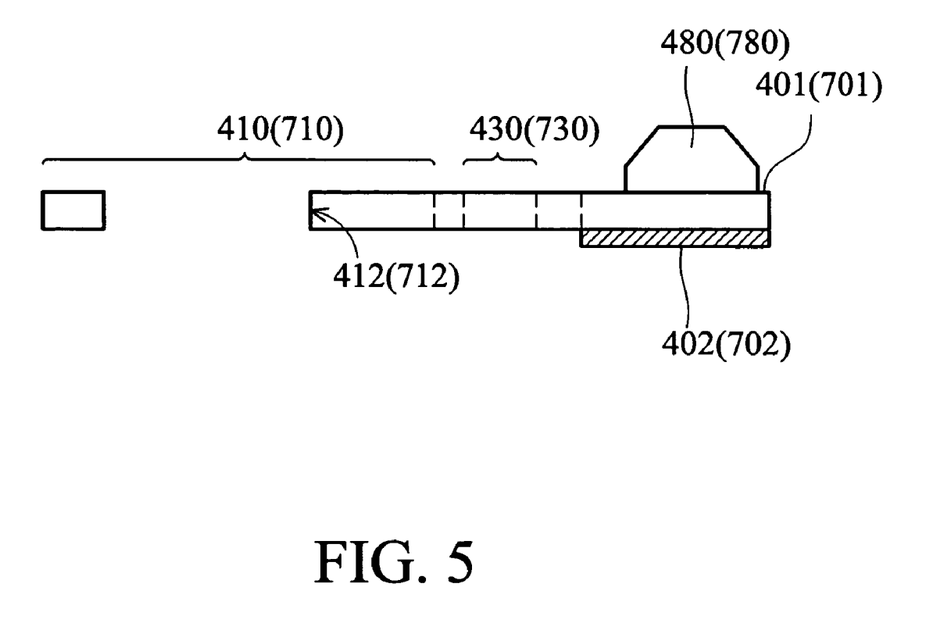
FIG. 5 is a cross-section of an additional step in the first and the second embodiments of the present invention.

Further, the second contact 421 of PCB 400 can be finger-shaped. Thus, the thermally enhanced packaging structures 1 and 2 can be manually mounted on or removed from the first external device, such as a connector pin or connector on the other PCB, to electrically connect thereto or disconnect therefrom. Furthermore, as shown in FIG. 5, a connector 480 can be soldered on the second contact 421. Thus, the first external device, such as another PCB, can be mounted on the connector 480, to make the thermally enhanced packaging structures 1 and 2 electrically connect to the finger-shaped contact on the other PCB. Soldering the connector 480 on the second contact 421 is preferably performed prior to the step shown in FIGS. 1E and 2E for less thermal process after attaching the chip 460 to the heat-conductive substrate 450 to improve the reliability of the thermally enhanced packaging structures 1 and 2.

As described, the chip 460 is directly encapsulated on the PCB 400, and the thermally enhanced packaging structures 1 and 2 can be manually mounted on and electrically connected to the first external device by the second contact 421. When the connector 480 is formed on the second contact 421, the first external device can be mounted on and electrically connected to the thermally enhanced packaging structures 1 and 2. Further, the chip 460 does not experience the thermal cycle from a thermal process such as reflowing, improving the reliability of the thermally enhanced packaging structures 1 and 2, and the assembled electronic products.

Further, providing a heat-conductive sheet or heat sink on the encapsulants 440 or 440' of the thermally enhanced packaging structures 1 and 2 is not necessary, to simplify the encapsulating step shown in FIGS. 1G, 2G or 1H, 2H, and further avoid a moisture diffusing along the interface in the package, which improves process yield and product reliability. Furthermore, cross-sectional area for heat transfer from chip 460 is increased to equal that of the chip 460, to improve the dissipation capability of the thermally enhanced packaging structures 1 and 2. Moreover, the heat-conductive substrate 450 not only dissipates heat from chip 460, but also strengthens the thermally enhanced packaging structures 1 and 2.

Second Embodiment

This embodiment describes a thermally enhanced packaging structure of an image IC and fabrication method thereof. Descriptions of laminating PCB and heat-conductive substrate and other prior steps for this embodiment are as same as those shown in FIGS. 1A through 1C and 2A through 2C (without the second external devices 31, 32, 41, and 42) or FIGS. 1A through 1D and 2A through 2D (with the second external devices 31, 32, 41, and 42).

FIGS. 3A through 3D are top views of a thermally enhanced packaging structure and fabrication method thereof of this embodiment. FIGS. 4A through 4D are cross-sections along line BB in FIGS. 3A through 3D, respectively.

Figure 3A:
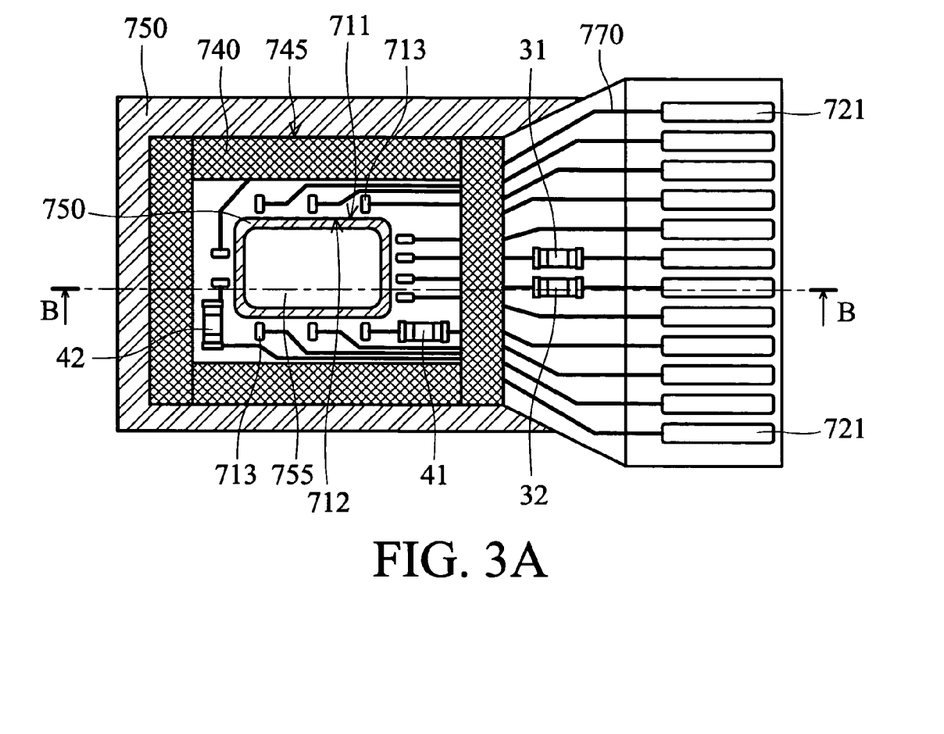
FIGS. 3A through 3D are top views of a thermally enhanced packaging structure and the fabrication method thereof according to the second embodiment of the present invention.
Figure 4A:
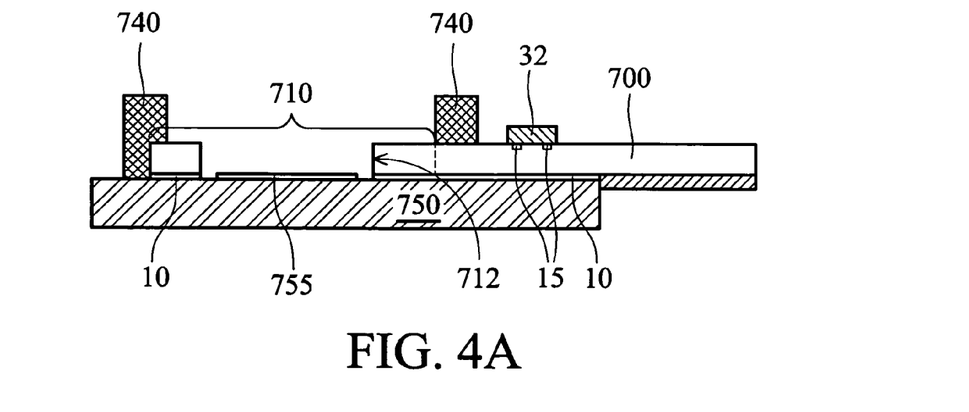
FIGS. 4A through 4D are cross-sections respectively related to FIG. 3A through 3D.

As shown in FIGS. 3A and 4A, a closed dam-shaped structure 740 is formed after the step shown in FIGS. 1D and 2D. The dam-shaped structure 740 protrudes from the top surface of substrate 700, surrounds and exposes chip attaching region 711. The dam-shaped structure 740 can cover parts of heat-conductive substrate 750 near the packaging area 710. The dam-shaped structure 740 can be made of FR4 resin, FR5 resin, BT resin (Bismaleimide Triazine), Dri-Clad™ (commercial name), polyimide, polyester, or encapsulating material as encapsulant 440 or 440' in FIG. 1G or 1H.

Figure 3B:
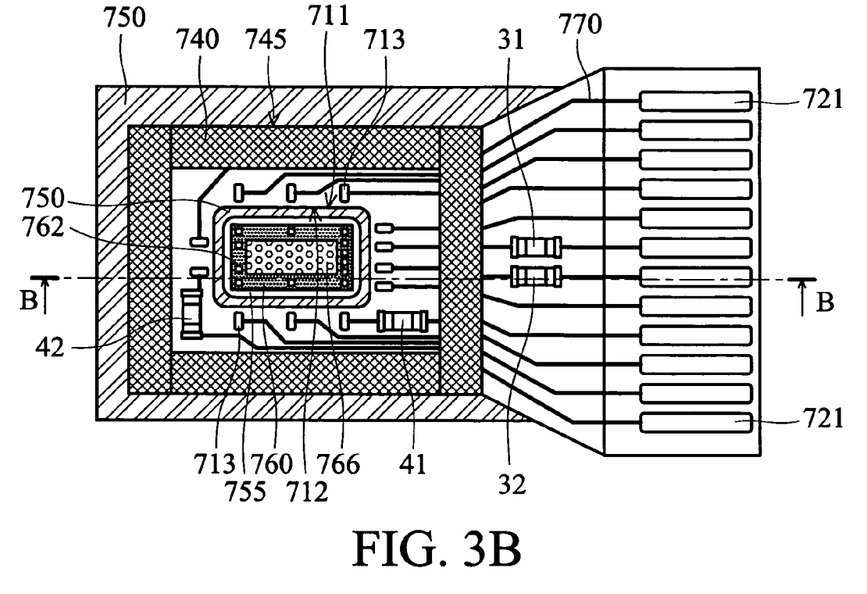
Figure 4B:
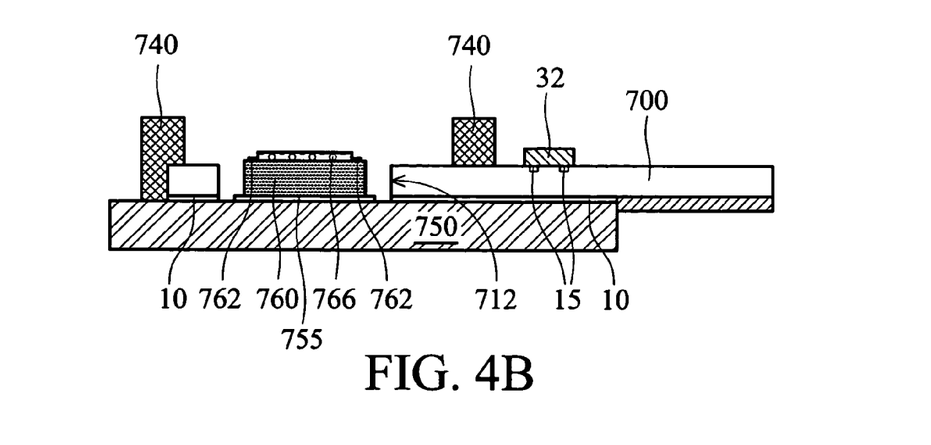

In FIGS. 3B and 4B, an image IC chip 760, having at least one bond pad 762 and image sensor 766, is placed in the hole 712 through PCB 700, attached to the heat-conductive substrate 750 exposed by the hole 712 by a method such as die bonding as mentioned above. When the die bond layer 755 (shown in FIG. 3A) is provided, bonding strength between chip 760 and heat-conductive substrate 750 is improved, enhancing process yield and product reliability of the method of fabricating a thermally enhanced packaging structure of this embodiment.

Figure 3C:
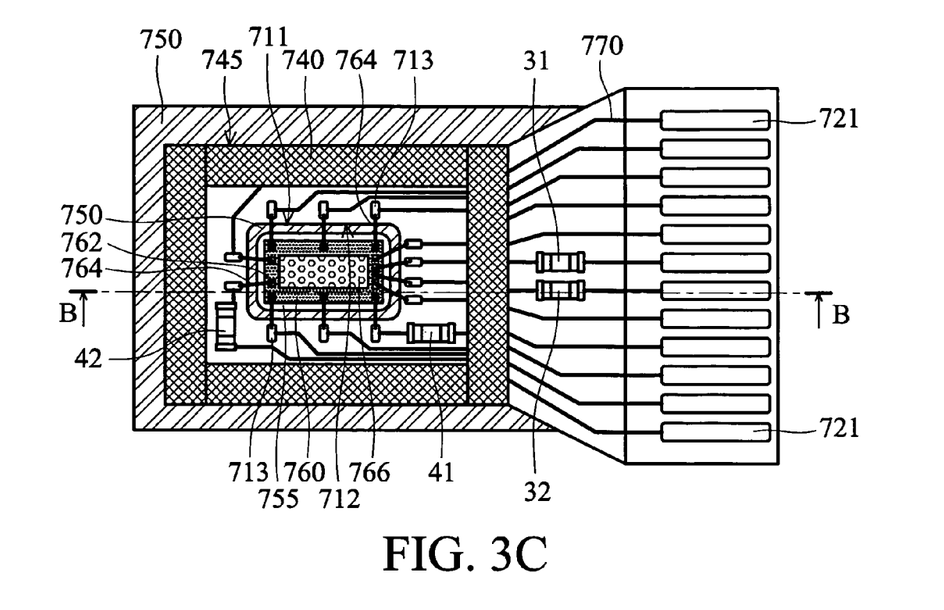
Figure 4C:
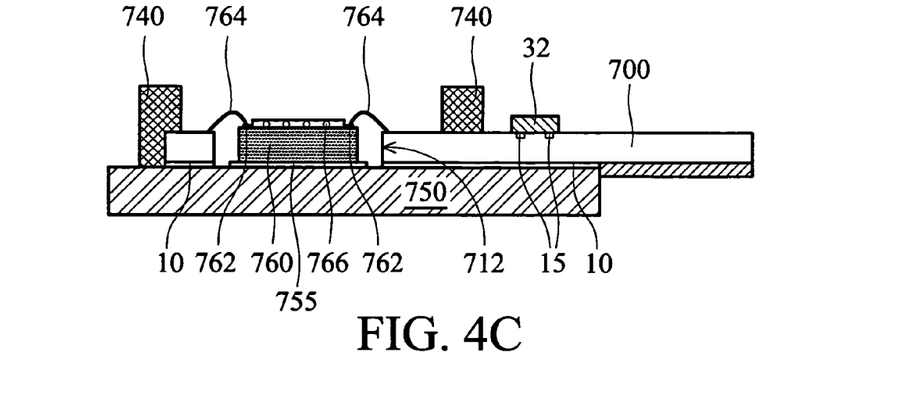

In FIGS. 3C and 4C, a conductor 764 is formed to electrically connect the first contact 713 and bond pad 762. The conductor 764 is normally gold or gold alloy, but may be aluminum in some situations. At this time, the second contact 721 electrically connects to chip 760 using wiring 770.

Figure 3D:
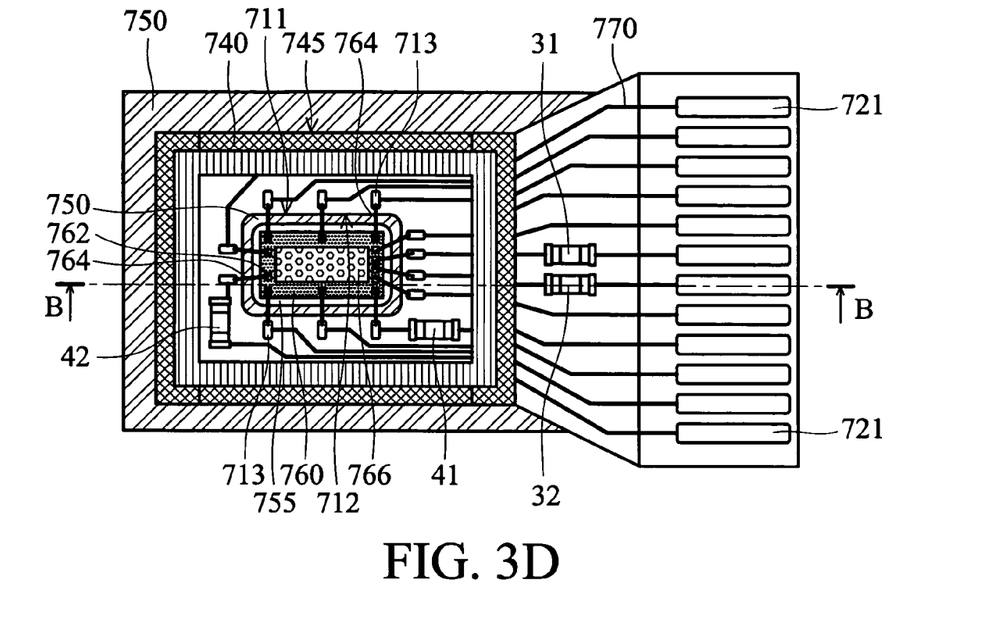
Figure 4D:
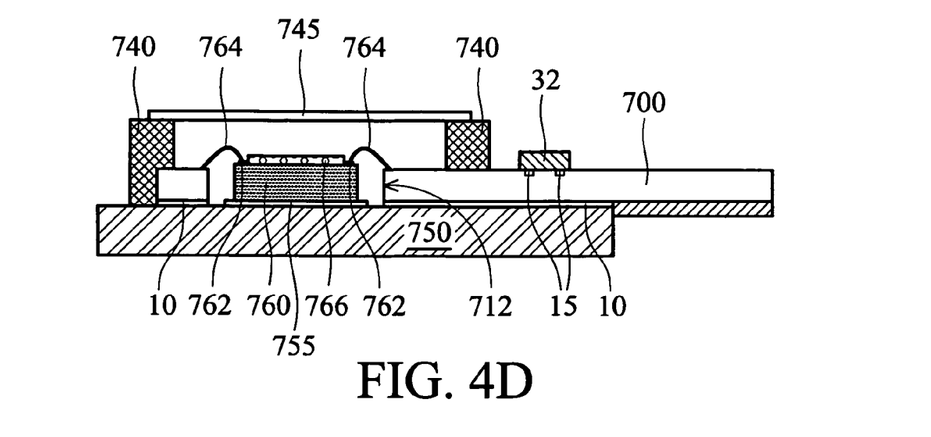

In FIGS. 3D and 4D, a transparent cap 745 is formed on dam-shaped structure 740, isolating chip 760, bond pad 762, conductor 764, image sensor 766, first contact 713, and optional second external devices 41, 42 from the external environment. A thermosetting or UV-curable glue layer (not shown) can be formed on the dam-shaped structure 740. The transparent cap 745 is then placed and fastened on the dam-shaped structure 740 by curing the glue layer using heat or UV irradiation. Thus the thermally enhanced packaging structure 3 of this embodiment is completed.

An application example of thermally enhanced packaging structures 1 and 2 is equivalent to those shown in FIGS. 2I and 2J, and abbreviated.

Further, the second contact 721 of PCB 700 can be finger-shaped. Thus, the thermally enhanced packaging structure 3 can be manually mounted on or removed from the first external device, such as a connector pin or connector on the other PCB, to electrically connect thereto or disconnect therefrom. Furthermore, as shown in FIG. 5, a connector 780 can be soldered on the second contact 721. Thus, the first external device, such as another PCB, can be mounted on the connector 780, to make the thermally enhanced packaging structure 3 electrically connecting to the finger-shaped contact on the other PCB. Soldering the connector 780 on the second contact 721 is preferably performed prior to the step shown in FIGS. 3B and 4B for fewer the thermal process after attaching the chip 760 to the heat-conductive substrate 750 to improve the reliability of the thermally enhanced packaging structure 3.

As described, the chip 760 is directly encapsulated on the PCB 700, and the thermally enhanced packaging structure 3 can be manually mounted on and electrically connected to the first external device by the second contact 721. When the connector 780 is formed on the second contact 721, the first external device can be mounted on and electrically connect to the thermally enhanced packaging structure 3. Further, the chip 760 and image sensor 766 do not experience the thermal cycle from a thermal process such as reflowing, improving the reliability of the thermally enhanced packaging structure 3, and the assembled electronic products.

Further, in the thermally enhanced packaging structure 3 of this embodiment, cross-sectional area for heat transfer from chip 760 is increased to equal that of the chip 760, to improve the dissipation capability of the thermally enhanced packaging structure 3. Moreover, the heat-conductive substrate 750 not only dissipates heat from chip 760, but also strengthens the thermally enhanced packaging structure 3.

Thus, the results show efficiency of the inventive structure and method preventing the need for packaged IC chip to undergo thermal cycle of reflow, improving dissipation capability of the package structure, and improving product reliability and structure strength, thereby achieving the objects of the present invention.

Although the present invention has been particularly shown and described with reference to the preferred specific embodiments and examples, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A method of fabricating a thermally enhanced packaging structure, comprising:
   (a) providing a printed circuit board (PCB) having a top surface and a bottom surface, the top surface having a packaging area and a first external device contact area, the packaging area having a chip attaching region and a first contact beyond the chip attaching region, the chip attaching region having a hole through the PCB, the first external device contact area having a second contact electrically connecting to the first contact;
   (b) providing a heat-conductive substrate having a first surface and a second surface;
   (c) laminating the first surface of the heat-conductive substrate and the bottom surface of the PCB, at least part of the heat-conductive substrate exposed by the hole through the PCB;
   (d) attaching a first chip, having a bond pad, to the heat-conductive substrate exposed by the hole through the PCB;
   (e) forming a conductor electrically connecting the first contact and the bond pad; and
   (f) forming an isolation structure isolating the first chip, the bond pad, the conductor, and the first contact from the external environment.

2. The method as claimed in claim 1, wherein the PCB further comprises a second external device contact area having a third contact electrically connecting the first contact and/or second contact, and further comprising, before step (d), a step:
   (g) providing a second external device electrically connecting to the third contact.

3. The method as claimed in claim 2, wherein step (g) further comprises:
   (g1) forming a solder paste on the third contact;
   (g2) providing the second external device on the third contact; and
   (g3) proceeding a reflow process, electrically connecting the second external device to the third contact.

4. The method as claimed in claim 3, further comprising:
   (g4) cleaning the PCB.

5. The method as claimed in claim 3, further comprising:
   (g5) forming a closed dam-shaped structure, protruding from the top surface of the PCB, around the chip attaching region and exposing the chip attaching region.

6. The method as claimed in claim 2, wherein the second external device comprises a passive device, a second chip, a package with a third chip, or combinations thereof.

7. The method as claimed in claim 1, wherein step (c) further comprises:
   (c1) forming a laminating material on the bottom surface of the PCB;
   (c2) assembling the first surface of the heat-conductive substrate and the bottom surface of the PCB;
   (c3) laminating the PCB and the heat-conductive substrate, curing the laminating material, fixing the PCB and the heat-conductive substrate.

8. The method as claimed in claim 1, wherein the heat-conductive substrate further comprises a die bond layer at least partially exposed by the hole through the PCB when the PCB and the heat-conductive substrate are laminated.

9. The method as claimed in claim 1, before step (c), further comprising:
   (h) forming a die bond layer on the heat-conductive substrate, the die bond layer at least partially exposed by the hole through the PCB when the PCB and heat-conductive substrate are laminated.

10. The method as claimed in claim 1, further comprising:
    (i1) forming a heat-conductive layer on the second surface of the heat-conductive substrate; and
    (i2) providing a heat dissipative media connecting to the heat-conductive substrate by using the heat-conductive layer.

11. The method as claimed in claim 1, wherein the first chip further comprises an image sensor isolated from the external environment by forming the isolation structure.

12. The method as claimed in claim 1, before step (d), further comprising:
(j) forming a closed dam-shaped structure, protruding from the top surface of the PCB, around the chip attaching region, exposing the chip attaching region.

13. The method as claimed in claim 12, step (f) further comprising forming a transparent cap overlaying the closed dam-shaped structure, isolating the first chip, the bond pad, the conductor, and the first contact from the external environment.

14. The method as claimed in claim 1, wherein an area of the heat-conductive substrate exposed by the hole through the PCB is larger than the first chip, thereby completely attaching the first chip to the heat-conductive substrate.

15. The method as claimed in claim 1, wherein the first chip is attached using die bonding process.

16. A thermally enhanced packaging structure, comprising:
a printed circuit board (PCB) having a top surface and a bottom surface, the top surface having a packaging area and a first external device contact area, the packaging area having a chip attaching region and a first contact beyond the chip attaching region, the chip attaching region having a hole through the PCB, the first external device contact area having a second contact electrically connecting to the first contact;
a heat-conductive substrate, having a first surface connecting to the bottom surface of the PCB and a second surface, partially exposed by the hole through the PCB;
a first chip, having a bond pad, attaching to the heat-conductive substrate exposed by the hole through the PCB;
a conductor electrically connecting the first contact and the bond pad; and
an isolation structure isolating the first chip, the bond pad, the conductor, and the first contact from the external environment.

17. The structure as claimed in claim 16, wherein the heat-conductive substrate is metal, ceramic, or a substrate with high heat dissipation capability.

18. The structure as claimed in claim 16, further comprising a die bond layer between the heat-conductive substrate and the PCB, the die bond layer partially exposed by the hole through the PCB.

19. The structure as claimed in claim 18, wherein the die bond layer is made of nickel/gold, tin-lead alloy, silver-containing alloy, or copper-containing alloy.

20. The structure as claimed in claim 16, wherein the PCB further comprises a second external device contact area beyond the chip attaching region and the first external device contact area, the second external device contact area having a third contact electrically connecting to the first contact and/or the second contact.

21. The structure as claimed in claim 20, further comprising a second external device electrically connecting to the third contact.

22. The structure as claimed in claim 21, wherein the second external device comprises a passive device, second chip, a package with a third chip, or combination thereof.

23. The structure as claimed in claim 16, wherein the first chip further comprises an image sensor isolated from the external environment by the isolation structure.

24. The structure as claimed in claim 16, further comprising a closed dam-shaped structure, protruding from the top surface of the PCB, around the chip attaching region, exposing the chip attaching region.

25. The structure as claimed in claim 24, further comprising a transparent cap overlaying the closed dam-shaped structure, isolating the first chip, the bond pad, the conductor, and the first contact from the external environment.

26. The structure as claimed in claim 16, wherein the isolation structure is made of FR4 resin, FR5 resin, BT resin, DriClad™, polyimide, polyester, or encapsulation molding compound used in IC assembly.

27. The structure as claimed in claim 16, wherein the isolation structure is made of thermosetting epoxy resin, polyimide, polyester, or encapsulation molding compound used in IC assembly.

28. The structure as claimed in claim 16, wherein the first external device is a connector pin assembly or a connector soldered onto the PCB.

29. The structure as claimed in claim 16, wherein the first external device is a second PCB or a second connector.

30. The structure as claimed in claim 16, further comprising a laminating material, between and connecting the PCB and the heat-conductive substrate.

31. The structure as claimed in claim 16, further comprising:
a heat-conductive layer on the second surface of the heat-conductive substrate; and
a heat dissipative media connecting to the heat-conductive substrate by using the heat-conductive layer.

* * * * *